United States Patent [19]

Mizugaki et al.

[11] Patent Number: 4,639,892
[45] Date of Patent: Jan. 27, 1987

[54] SEMICONDUCTOR READ-ONLY MEMORY DEVICE

[75] Inventors: Shigeo Mizugaki; Tsunenori Umeki, both of Itami, Japan

[73] Assignee: Mitsubishi Denki Kabushiki Kaisha, Tokyo, Japan

[21] Appl. No.: 556,387

[22] Filed: Nov. 30, 1983

[30] Foreign Application Priority Data

Nov. 30, 1982 [JP] Japan .................................. 57-211601

[51] Int. Cl.⁴ .............................................. G11C 11/40
[52] U.S. Cl. .................................. 365/182; 357/23.12;
365/189; 365/51
[58] Field of Search ............... 365/104, 103, 178, 182, 365/94, 51, 189; 357/23.12

[56] References Cited

U.S. PATENT DOCUMENTS

| | | | |
|---|---|---|---|
| 4,272,830 | 6/1981 | Moench | 365/103 |
| 4,322,823 | 3/1982 | Pricer et al. | 357/23.12 |
| 4,395,725 | 7/1983 | Parekh | 357/23.12 |
| 4,410,904 | 10/1983 | Wollesen | 357/23.9 |
| 4,480,320 | 10/1984 | Naiff | 365/104 |
| 4,500,975 | 2/1985 | Shirato | 365/104 |

FOREIGN PATENT DOCUMENTS 0072079  5/1980  Japan .................................. 357/23.12

58-51427 11/1983 Japan .

OTHER PUBLICATIONS

IBM Technical Disclosure Bulletin, "Variation in Threshold Voltage Using Reduced Source–Drain Spacing" by R. H. Dennard, vol. 12, No. 9, Feb. 1970, p. 1391.
Fabrication of High–Performance LDDFET's with Oxide Sidewall–Spacer Technology, Tsang et al, IEEE Transactions, vol. ED-29, No. 4, 1982, pp. 590-596.

Primary Examiner—Terrell W. Fears
Attorney, Agent, or Firm—Lowe, Price, LeBlanc, Becker & Shur

[57] ABSTRACT

A semiconductor read-only memory device includes first and second MOS field effect mode transistors (MOSFET) as memory elements storing either one of binary values of binary information. The first MOSFET has such a relatively long effective gate length that it becomes conductive upon receipt of a first relatively high gate voltage applied thereto as a memory selection signal and becomes non-conductive upon receipt of a second relatively low gate voltage. The second MOSFET, on the other hand, has such a relatively short effective gate length that it becomes conductive whether the first or second gate voltage is applied thereto.

11 Claims, 8 Drawing Figures

SEMICONDUCTOR READ-ONLY MEMORY DEVICE

BACKGROUND OF THE INVENTION

1. Field of the Invention

This invention relates to a semiconductor read-only memory device (ROM), and more particularly it relates to a semiconductor ROM using two kinds of MOS type field effect mode transistors (MOSFET) as memory elements storing either one of two different values of information.

2. Description of the Prior Art

FIG. 1 is a circuit diagram showing only a primary portion of a typical conventional ROM. A ROM memory array includes a good number of memory banks only two of which are illustrated as generally designated by 1 and 2 in FIG. 1. The memory bank 1 includes serially connected MOSFET's 11-14 for storage and the memory bank 2 includes serially connected MOSFET's 21-24 for storage. Of those MOSFET's the MOSFET's 12, 14 and 23 are of the depletion type and the remaining MOSFET's 11, 13, 14, 21, 22 and 24 are of the enhancement type. The gates of the respective MOSFET's are connected to terminals 71-74 and 81-84 to receive its corresponding memory selection signals. One end of a series circuit of the MOSFET's 71-74 is connected to a bit line 7 and one end of the counterpart of the MOSFET's 81-84 is connected to a bit line 8. The bit lines 7 and 8 have bit line capacitors 3 and 4, respectively. Each bit line has its one end connected to a charging circuit 5 for charging the bit line and its other end connected to a readout circuit 6, respectively.

Assuming for the convenience of explanation only that all of the MOSFET's 11-14 and 21-24 are of the n channel type, the following will set forth operation of the ROM of FIG. 1.

First of all, consideration will be given to the situation that the memory selection signal terminals 71 and 81 are held at a low level "L" (e.g. approximately 0V in a system of 5 V of power supply voltage) and all of the remaining memory selection signal terminals are held at a high level "H" (e.g. approximately 5 V in a system of 5 V of power supply voltage). The bit line capacitors 3 and 4 are charged through the charging circuit 5. Since in this case the memory MOSFET's 11 and 21, which are supplied at respective gates thereof with the "L" signal, are both of the enhancement type, these MOSFET's stand in the off state. The gates of the remaining memory MOSFET's are supplied with the "H" signal and all stand in the on state whether they are of the depletion type or the enhancement type. With the memory MOSFET's 11 and 21 in the off state, the charges on the bit line capacitors 3 and 4 are not discharged and the readout circuit 6 senses a "H" potential at both the memory banks 1 and 2.

Then, for example, the memory selection signal terminals 72 and 82 are brought to a "L" level and the remaining memory selection signal terminals to a "H" level. The bit line capacitors 3 and 4 are charged. Under these circumstances the memory MOSFET's 12 and 22 which are supplied with the "L" signal are in the on state and off state, respectively, because the former is of the depletion type and the latter of the enhancement type. The remaining memory MOSFET's receiving at its gates the "H" signal stand in the on state whether they are of the depletion type or the enhancement type. The charge on the bit line capacitor 4 is not discharged due to the memory MOSFET 22 in the off state. The readout circuit 6, therefore, senses the "H" potential for the memory bank 2. On the contrary, with all of the memory MOSFET's 11-14 in the memory bank 1 in the on state, the charge on the bit line capacitor 3 is discharged therefrom and the readout circuit 6 senses the "L" potential for the memory bank 1.

In this manner, the "H" potential is sensed upon selection of the enhancement type memory MOSFET and the "L" potential is sensed upon selection of the depletion type memory MOSFET. It will be understood that ROM operation is expected provided that these potentials correspond to "1" and "0" bits of information.

To ensure high speed performance with the above described ROM arrangement, it is required to sufficiently lower the on-resistance of the depletion type memory MOSFET's when the gate voltage is "L" and to shorten the discharge time of the bit line capacitors. This implies that ion injection to the channel regions of the depletion type memory MOSFET's should be carried out in a separate step form ion injection to depletion type MOSFET's in peripheral logic circuits, resulting in increasing the number of manufacturing steps. Another outstanding problem is that manufacture is time-consumptive because of the need to form the gates after completion of channel doping.

SUMMARY OF THE INVENTION

This invention is directed to a semiconductor read-only memory device using two kinds of MOS field effect mode transistors as memory elements each corresponding to either one of two different values of binary information.

According to the present invention, there is provided a semiconductor read-only memory device including a first MOS field effect mode transistor for storage of one value of binary information and a second MOS field effect mode transistor for storage of the other value of binary information, said first and second MOS field effect mode transistors being formed on a semiconductor substrate and having a gate electrode respectively on one major surface of said substrate, wherein said first MOS field effect mode transistor has such a relatively long effective gate length that it becomes conductive upon receipt of a first gate voltage of a relatively high absolute value applied thereto and becomes non-conductive upon receipt of a second gate voltage of a relatively low absolute value applied thereto, and said second MOS field effect mode transistor has such a relatively short effective gate length that it becomes conductive whether said first gate voltage or said second gate voltage is applied thereto.

Accordingly, it is a primary object of the present invention to provide a new method for making a ROM which offers advantages in reduction of the number of steps by setting up characteristics of depletion type MOSFET's without the step of channel doping through a mere modification in a graded drain technique widely used for formation of source and drain regions of short-channel MOSFET's, as well as shortening of time necessary for manufacture by locating the step of defining the enhancement type and depletion type of the step writing the memory at a later step than ever.

It is an another object of the present invention to provide a ROM which has the advantage of ease in manufacture and enhancement in operation speed by using as two kinds of MOS type field effect mode transistors for storage of binary information, first MOS type field effect mode transistor having such a relatively long effective gate length that it becomes conductive upon receipt of a first gate voltage of a relatively high absolute value applied thereto and becomes non-conductive upon receipt of a second gate voltage of a relatively low absolute value applied thereto and second MOS field effect mode transistor having such a relatively short effective gate length that it becomes conductive whether said first gate voltage or said second gate voltage is applied thereto.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
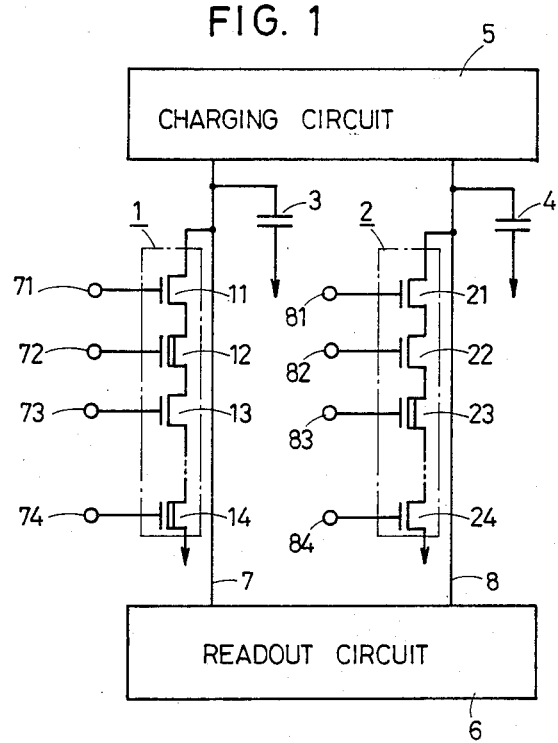
FIG. 1 is a schematic circuit diagram showing only a major portion of a typical conventional semiconductor read-only memory device.
Figure 2:
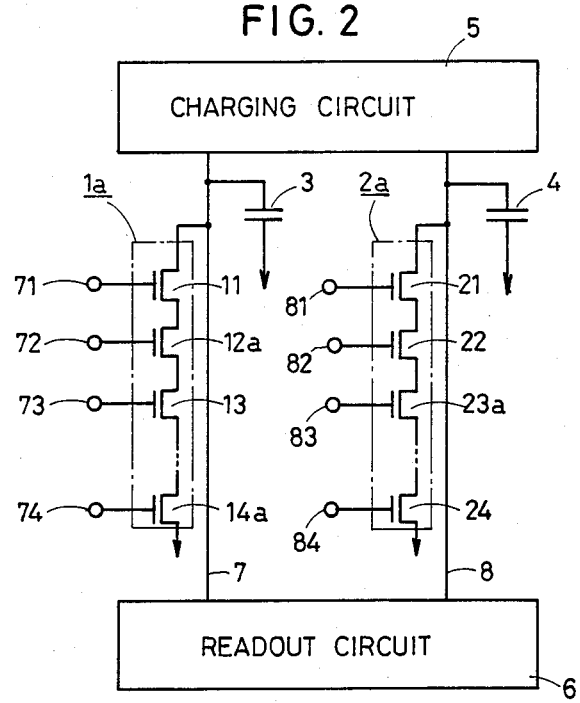
FIG. 2 is a schematic circuit diagram showing only a major portion of a semiconductor read-only memory device according to an embodiment of the present invention.

In FIG. 2, there is illustrated a schematic circuit diagram of only a major portion of a semiconductor read-only memory device (ROM) according to an embodiment of the present invention, wherein components similar to those in the conventional device of FIG. 1 are designated by the same reference numbers. Of memory banks constituting a memory array, only two memory banks 1a and 2a are illustrated in FIG. 2. The memory bank 1a includes serially connected memory MOSFET's 11, 12a, 13 and 14a for storage and the memory bank 2a includes serially connected memory MOSFET's 21, 22, 23a and 24 for storage. Out of these MOSFET's, the MOSFET's 11, 13, 21, 22 and 24 are of the enhancement type like the conventional device and have its source and drain regions which are defined by relatively shallow diffusion of a dopant. The remaining MOSFET's 12a, 14a and 23a are MOSFET's the source and drain regions of which are defined by relatively deep diffusion as compared with relatively shallow diffusion generally used for formation of the source and drain regions of the conventional MOSFET's of the enhancement type.

Figure 3:
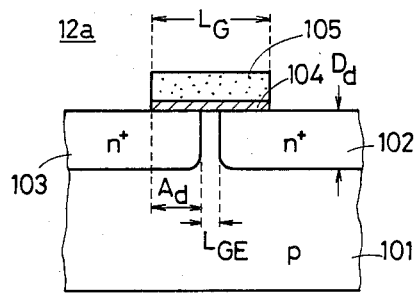
FIG. 3 is a cross-sectional view of a MOS field effect mode transistor (MOSFET) having relatively deep source and drain diffusion regions used with the present invention.

FIG. 3 is a cross-sectional view of a MOSFET having relatively deep source and drain diffusion regions incorporated in the ROM in accordance with the present invention. A source diffusion layer 102 and a drain diffusion layer 103 of first conductive type (e.g. n+ type) are developed by diffusing a dopant into a semiconductor substrate 101 of second conductive type up to a relatively deep depth Dd, with a gate electrode 105 of a length $L_G$ overlying the semiconductor substrate 101 of p type via a gate oxide coating 104 (e.g. $SiO_2$) serving as a mask. For example, a silicon substrate of specific resistance $20\pm3\Omega\cdot cm$ is used as the semiconductor substrate 101. The depth Dd of the source and drain diffusion layer may be 0.5 μm and the impurity concentration of the same may be in the neighborhood of solid solubility (e.g. $4 \times 10^{15} cm^{-3}$ at the depth of 0.4 μm). The gate length $L_G$ may be 2 μm.

The source diffusion layer 102 and the drain diffusion layer 103 which have the relatively deep depth Dd are developed by double diffusion using the gate electrode 105 as a mask.

Because of the diffusion depth Dd being relatively deep, lateral diffusion expansion Ad beneath the gate 105 used as the mask is significant (e.g. 0.4 to 0.5 μm at the diffusion depth of 0.5 μm) and the effective gate length $L_{GE}$ ($=L_G-2Ad$) is very short (e.g. $2-2\times(0.4$ to $0.5)=1$ to 1.2 μm). For this reason, with a low source-drain voltage, punch-through takes place and the MOSFET is turned to the on state.

Figure 4:
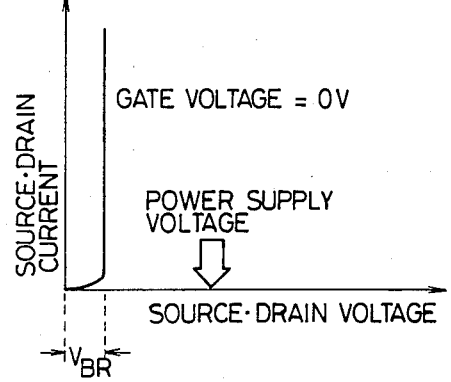
FIG. 4 shows source-drain voltage vs. current characteristics when the gate voltage of the MOSFET of FIG. 3 is 0 volts.

FIG. 4 depicts source-drain voltage vs. current characteristics of the MOSFET of FIG. 3 when the gate voltage is 0 volts, with the abscissa plotted with source-drain voltage and the ordinate plotted with source-drain current. It is evident from FIG. 4 that in the case of the MOSFET having the relatively deep source and drain diffusion layers as shown in FIG. 3 punch-through or breakdown takes place in response to a low source-drain voltage (punch-through voltage or breakdown voltage $V_{BR}$) even when the gate voltage is 0 volts. Therefore, if a power supply voltage across the source and the drain is higher than the breakdown voltage $V_{BR}$ as suggested by the arrow in FIG. 4, for example, then the MOSFET of FIG. 3 constantly stands in the on state when the gate voltage is 0 volts. This condition is readily accomplished by proper selection of the diffusion depth Dd and hence the effective gate length $L_{GE}$.

Figure 5:
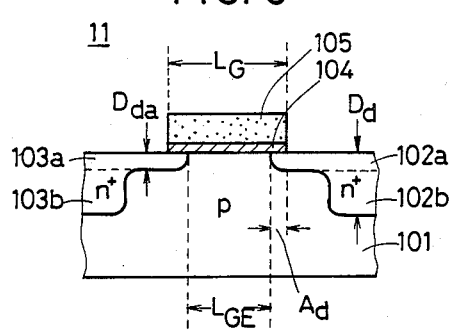
FIG. 5 is a cross-sectional view of a MOSFET having relatively shallow source and drain diffusion regions used with the present invention.

FIG. 5 is a cross-sectional view of a MOSFET having relatively shallow source and drain diffusion layers for use in the present invention. The MOSFET with the shown structure is completed through the following two steps. The first step is to diffuse a first conductive type (e.g. n+ type) dopant into a relatively shallow depth Dda in a second conductive type (e.g. p type) semiconductor substrate 101 with a gate electrode 105 disposed on the substrate 101 via a gate oxide coating 104 used as a mask therefor, thereby implanting relatively shallow n+ type diffusion layers 102a and 103a. For example, the semiconductor substrate may be of silicon of specific resistance $20\pm3\Omega\cdot cm$. The relatively shallow depth Dda of the layers 102a and 103a may be 0.15 μm.

Figure 6:
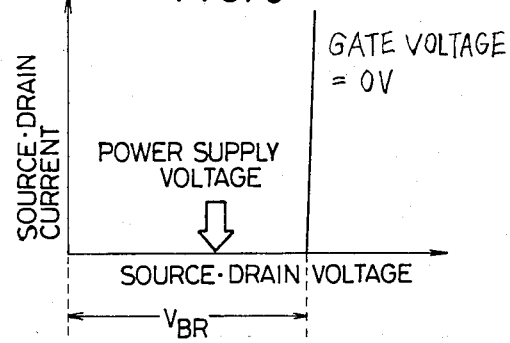
FIG. 6 shows source-drain voltage vs. current characteristics when the gate of the MOSFET of FIG. 5 is supplied with 0 volts.

Because of the relatively shallow diffusion depth Dda, lateral diffusion expansion beneath the gate electrode 105 used as the mask is small and the effective gate length $L_{GE}$ ($=L_G-2Ad$) is sufficiently long. For example, the lateral diffusion expansion Ad is 0.1 to 0.15 μm at the concentration depth Dda of 0.15 μm and, therefore, the effective gate length $L_{GE}$ is 1.7 to 1.8 μm. The MOSFET resulting from the first step manifests characteristics similar to that of the conventional enhancement type MOSFET as shown in FIG. 6. That is, if and when the gate voltage is 0 volts, the breakdown voltage $V_{BR}$ between the source and the drain is higher than the power supply voltage as depicted by the arrow so that the MOSFET stands in the off state.

The second step is to carry out diffusion into a relatively deep depth Dd using a mask (not shown) greater than the gate electrode 105, thereby forming relatively deep n+ diffusion layers 102b and 103b as an extension of the n+ diffusion layers 102a and 103a grown during the first step. The depth Dd of the layers 102b and 103b may be 0.5 μm and impurity concentration of the same may be $4 \times 10^{15}$ cm$^{-3}$ at the concentration depth of 0.4 μm.

It will be readily understood that the effective gate length $L_{GE}$ would not be reduced during the second step. The relatively deep n+ diffusion layers 102b and 103b, grown during the second step are effective in substantially decreasing the resistance of the n+ source and drain diffusion layers.

Reverting to FIG. 2, operation of the semiconductor ROM according to the preferred embodiment of the present invention will be discussed. The memory selection terminals 71 and 81 are brought to a low level "L" and all of the remaining memory selection terminals to a high level "H". The bit line capacitors 3 and 4 are charged through the charging circuit 5. When this occurs, the memory MOSFET's 11 and 21 which are supplied at their gates with the "L" signal are in the off state because both are of the type with shallow diffusion like the conventional enhancement type MOSFET. All of the other memory MOSFET's supplied at its gates with the "H" signal stand in the on state whether they are of the shallow diffusion type or the deep diffusion type. With the memory MOSFET's 11 and 12 in the off state, the charges on the bit line capacitors 3 and 4 are not discharged and the readout circuit 6 finds a "H" potential for the two memory banks 1 and 2.

Then, the memory selection signal terminals 72 and 82 are brought to the "L" level and all of the other memory selection signal terminals to the "H" level. The bit line capacitors 3 and 4 are charged. The memory MOSFET 12a supplied at its gate with the "L" signal is in the on state and the memory MOSFET 22 supplied at its gate with the "L" signal is in the off state because the former is of the deep diffusion type and the latter of the shallow diffusion type. All of the remaining memory MOSFET's are in the on state while being supplied at their gates with the "H" signal, regardless of whether they are of the deep diffusion type or the shallow diffusion type. The memory MOSFET 22 in the off state does not permit discharging of the charge on the bit line capacitor 4, so that the readout circuit 6 finds a "H" potential in conjunction with the memory bank 2. However, on the other hand, the readout circuit 6 senses a "L" potential in conjunction with the memory bank 1 since the memory MOSFET's 11–14 in the memory bank 1 are all turned to the on state and, consequently, the charge on the bit line capacitor 3 is discharged away.

In a similar manner as above, the "H" potential is sensed upon selection of the shallow diffusion type memory MOSFET and the "L" potential is sensed upon selection of the deep diffusion type memory MOSFET.

In other words, ROM operation is expected provided that these potentials correspond to "1" and "0" bits of information.

As noted earlier, pursuant to the teachings of the present invention, the enhancement type MOSFET's in the conventional ROM memory array are replaced by the shallow diffusion type MOSFET's having the long effective gate length $L_{GE}$ as indicated in FIG. 5 and the depletion type MOSFET's are replaced by the deep diffusion type MOSFET's having the short effective gate length $L_{GE}$ as shown in FIG. 3.

Figure 7:
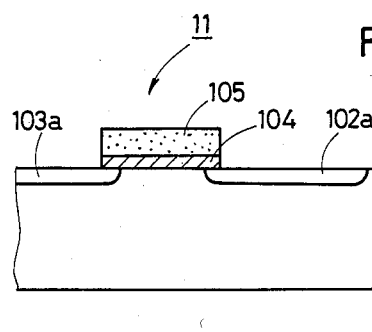
FIGS. 7 and 8 are cross-sectional views of ROM's in different manufacturing steps in accordance with the present invention only showing a MOSFET having relatively deep source and drain diffusion regions and a MOSFET having relatively shallow source and drain diffusion regions.
Figure 8:
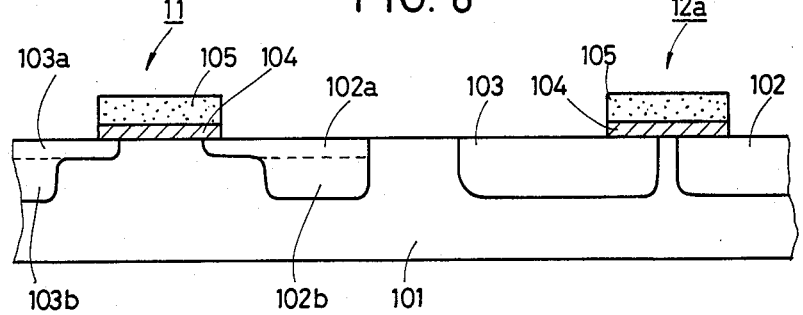

A preferred method for making the semiconductor ROM memory array according to the present invention will now be described by making reference to FIGS. 7 and 8. FIGS. 7 and 8 are cross-sectional views of a ROM in accordance with the present invention showing only the portions of the shallow and deep diffusion type MOSFET'S. As shown in FIG. 7, after disposition of the gate electrodes of all of the memory MOSFET's, shallow diffusion is carried out using the gate electrodes as a mask until the first diffusion step in FIG. 5 is completed. Thereafter, as shown in FIG. 8, diffusion is carried out again while, according to a desired pattern of storing (permanently writing) information, MOSFET's to be formed as the shallow diffusion type are covered with a mask greater than the gate electrodes and those to be formed as the deep diffusion type are again covered only with the gates thereof as a mask. The result is the development of the shallow diffusion type MOSFET's having the long effective gate length $L_{GE}$ as indicated in FIG. 5 and the deep diffusion type MOSFET's having the short effective gate length $L_{GE}$ as in FIG. 3.

Accordingly, the present invention enables a memory MOSFET array having a desired characteristic to be formed by effecting the first step of the conventional double diffusion process, that is, shallow diffusion commonly to all of the memory elements and thereafter effecting the second step for deep diffusion with the desired elements covered with the different masks. The advantages of the present invention include elimination of the step of channel doping as experienced in the fabrication of the depletion type MOSFET's and simplicity in the manufacturing steps and shortage of manufacturing period after acceptance of orders due to the fact that application of storing information to the ROM may be carried out at the final step of manufacture. The ROM in accordance with the present invention also have the advantage of easiness in manufacture and enhancement in operation speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor read-only memory device having at least first and second different types of MOS field effect transistor means for storage of different values of data bits, said first and second types of MOS transistor means formed on a substrate and in electrical connection with each other, each transistor means having a gate electrode means on a major surface of said substrate defining a gate area therein, said first type of MOS transistor means including two-level turn on means for causing said type of MOS field effect transistor to be turned on in response to application of either of a first or second different voltage level to the gate electrode means thereof, said two-level turn on means comprising a structural arrangement including double diffusion deep and shallow drain and sink regions with substantial lateral diffusion expansion regions, said lateral diffusion exapnsion regions providing a reduced effective gate length, said reduced effective gate length being substantially shorter than the width of said gate electrode means thereof for simulating a depletion type MOS transistor independently of channel doping thereof, said second type of MOS transistor means including on-off means for causing said second type of MOS field effect transistor to be turned on in response to application of said first voltage level to the gate electrode means thereof and to be turned off in response to application of said second voltage level to the gate electrode means thereof, said on-off means comprising a structural arrangement including a graded drain structure with deep diffusion drain and sink regions and shallow diffusion regions at least adjacent said gate electrode means thereof thereby minimizing reduction of effective gate length and providing a substantially longer effective gate length than the effective gate length of said first type of transistor means.

2. A semiconductor read-only memory as recited in claim 1 wherein said relatively shallow diffusion regions are formed in said drain and sink regions of said second type of MOS transistor means.

3. A semiconductor read-only memory as recited in claim 1 wherein said substrate comprises a semiconductor doped by an impurity of one conductivity type and said diffused source and drain regions are doped by an impurity of an opposite conductivity type, said gate area including only impurity of said one conductivity type of said substrate.

4. A semiconductor read-only memory device in accordance with claim 1 wherein said second type of MOS field effect transistor means comprises a gate electrode mask means for forming said shallow diffusion regions thereof in a first diffusion, prior to an additional diffusion for forming said deep diffusion regions thereof by a second mask means wider than said gate electrode mask means, thereby preventing said substantially longer effective gate length from substantially reducing during said additional diffusion, wherein said first type of MOS field effect transistor means comprises a gate electrode mask means for forming both shallow and deep diffusion regions thereof in two diffusions, thereby causing substantial lateral diffusion for reducing the effective gate length of said first type of MOS field effect transistor means to be substantially shorter than the width of said electrode gate means thereof, and wherein said gate electrode mask means of each of said transistor means is comprised of the respective gate electrode means thereof.

5. A semiconductor read-only memory device in accordance with claim 4 wherein said electrode gate means of said first and second type MOS transistor means each have a substantially identical, common, width, and wherein said first type MOS transistor means includes an effective gate length substantially shorter than the common width of said electrode gate means thereof and said second type MOS transistor means includes an effective gate length substantially similar to the common width of said electrode gate means thereof.

6. A semiconductor read-only memory device in accordance with claim 1 wherein said electrode gate means of said first and second type MOS transistor means each have a substantially identical, common, width, and wherein said first type MOS transistor means includes an effective gate length substantially shorter than the common width of said electrode gate means thereof and said second type MOS transistor means includes an effective gate length substantially similar to the common width of said electrode gate means thereof.

7. A semiconductor read-only memory device having at least first and second different types of MOS field effect transistor means for storage of different values of data bits, said first and second types of MOS transistor means formed on a substrate and in electrical connection with each other, each transistor means having a gate electrode means on a major surface of said substrate defining a gate area therein, said gate electrode means of said two types of MOS transistors having substantially identical, common, widths, said first type of MOS transistor means having double diffusion deep and shallow drain and sink regions and substantial lateral diffusion expansion regions extending therefrom to a region below said gate electrode means thereof and providing to said first type of MOS transistor means a reduced effective gate length substantially shorter than the common width of said gate electrode means thereof for simulating a depletion type MOS transistor independently of channel doping thereof, said second type of MOS transistor means having a graded drain structure including deep diffusion drain and sink regions, formed by a deep diffusion using a mask wider than the width of said gate electrode means of said second type of MOS transistor, and shallow diffusion regions at least adjacent said gate electrode means thereof, said shallow diffusion regions formed by a shallow diffusion using a mask having substantially the same width as said gate electrode means of said second type of MOS transistor, thereby providing to said second type of MOS transistor means a substantially longer effective gate length than the effective gate length of said first type of transistor means for simulating an enhancement type MOS transistor.

8. A semiconductor read-only memory device in accordance with claim 2 wherein said shallow source and drain diffusion regions comprise diffusion regions developed through diffusion using a mask of substantially the same width as said gate electrode, and wherein said deep source and drain diffusion regions of said second transition means comprise first diffusion regions developed through diffusion using a mask of substantially the same width as said gate electrode concurrently to said diffusion intended for development of said shallow source and drain regions, and second diffusion regions developed through succeeding second diffusion using a mask of substantially the same width as said gate electrode, said second diffusion regions being contiguous to said first diffusion regions.

9. A semiconductor read-only memory device in accordance with claim 8 wherein each of said gate electrodes serves as said mask of substantially the same width as said gate electrodes.

10. A semiconductor read-only memory device in accordance with claim 1 wherein said deep diffusion regions of said second type of MOS field effect transistor means are formed in a separate diffusion by a mask of a width greater than the width of said gate electrode means thereof, whereby said substantially longer effective gate length is prevented from substantially reducing during said additional diffusion.

11. A semiconductor read-only memory device in accordance with claim 10 wherein said relatively deep diffusion regions of said second type of MOS field effect transistor means includes an additional diffusion region developed concurrently to a second diffusion region of said first type of MOS field effect transistor means.

* * * * *